United States Patent [19]
Wang et al.

[11] Patent Number: 5,789,297
[45] Date of Patent: Aug. 4, 1998

[54] METHOD OF MAKING EEPROM CELL DEVICE WITH POLYSPACER FLOATING GATE

[75] Inventors: Chih-Hsien Wang; Min-Liang Chen, both of Hsinchu; Thomas Chang, Taichung, all of Taiwan

[73] Assignee: Mosel Vitelic Inc., Hsinchu, Taiwan

[21] Appl. No.: 736,390

[22] Filed: Oct. 24, 1996

[51] Int. Cl.⁶ .................................................. H01L 21/8247
[52] U.S. Cl. ........................ 438/267; 438/304; 438/596
[58] Field of Search .................................. 438/266, 267, 438/304, 305, 593, 596

[56] References Cited

U.S. PATENT DOCUMENTS

| | | | |
|---|---|---|---|
| 4,622,737 | 11/1986 | Ravaglia | 438/266 |
| 5,284,784 | 2/1994 | Manley | 438/267 |
| 5,478,767 | 12/1995 | Hong | 438/304 |
| 5,550,073 | 8/1996 | Hong | 438/267 |

*Primary Examiner*—Chandra Chaudhari
*Attorney, Agent, or Firm*—Christensen, O'Connor, Johnson & Kindness PLLC

[57] ABSTRACT

A novel electrically erasable programmable read only memory (EEPROM) cell for use in semiconductor memories includes a polyspacer floating gate. The EEPROM structure also includes a select gate covering a part of the channel of the EEPROM cell, with a polysilicon spacer adjacent to the select gate. The polysilicon spacer implements a floating gate that holds charge to program the EEPROM cell. In one embodiment, a isolation layer separates the select gate and the floating gate. The isolation layer and the floating gate extends over the remaining part of the channel. A second isolation layer is formed over select gate and the floating gate. A control gate is formed on the isolation layer. Between the drain and the control gate is the second isolation layer. A lightly doped drain (LDD) structure is formed at the drain adjacent.

3 Claims, 4 Drawing Sheets

METHOD OF MAKING EEPROM CELL DEVICE WITH POLYSPACER FLOATING GATE

FIELD OF THE INVENTION

The present invention relates to an electrically erasable programmable read only memory (EEPROM) cell and, more particularly, to an EEPROM cell having a polysilicon spacer floating gate.

BACKGROUND OF THE INVENTION

The erasable non-volatile memory market has been divided for historical reasons into four fairly distinct product segments. These include the EAROM (electrically alterable ROMs), EEPROM, EEPROM-EAROMs and non-volatile SRAMs (static RAMs). Different types of devices have been developed for specific applications requirements in each of these segments. Low density (below 8k) EAROMs have been used in such applications as consumer radio tuners, automotive engine controllers, etc. Medium density EEPROMs are often used in microprocessor based applications such as distributed systems or changeable software storage. These parts have been developed with a focus on high reliability and high speed environments.

Currently, the four basic technologies used to manufacture electrically reprogrammable ROMs typically utilize to some extent what is referred to as Fowler-Nordheim tunneling. Fowler-Nordheim tunneling is thought to be cold electron tunneling through the energy barrier at a silicon—silicon dioxide interface into the oxide conduction band. The earliest electrically reprogrammable ROM process in the early 1970s utilized a metal-nitride-oxide silicon (MNOS) combination for the gate region of a P-channel storage cell producing EAROMs.

Many memory manufacturers choose a thin oxide floating gate process to make an electrically erasable PROM. The basic memory cell consists of an access transistor and a double polysilicon storage cell with a floating polysilicon gate isolated in silicon dioxide capacitively coupled to a second polysilicon control gate which is stacked above it.

One conventional erasable programmable read only memory (EPROM) cell is shown in FIG. 1. The device is formed on a semiconductor substrate $1p$ and comprises a control gate $9p$, a floating gate $7p$, a gate oxide $5p$ and field oxide regions $3p$. The field oxide regions $3p$ are used for isolation between EPROM cells.

FIG. 2 shows a cross-sectional view of a conventional floating gate electrically erasable programmable read only memory EEPROM cell. EEPROMs typically opearate in a program mode, an erase mode, and a read mode. In the program mode, the source region is held at a high positive voltage and the control gate $9p$ is held at a negative voltage. Consequently, the EEPROM cell is programmed by Fowler-Nordheim tunneling of electrons through the thin gate oxide $5p$ between the floating gate and the source region of the cell. Electrons tunneling from the floating gate $7p$ to the source region leave the floating gate $7p$ relatively more positively charged. The positively charged floating gate $7p$ shifts the threshold voltage of the memory cell in the negative direction so that in the read mode the transistor will be 'on'.

In the erase mode, the control gate $9p$ is held at high positive voltage while the drain region is grounded (i.e., coupled to a source of ground potential). Electrons tunnel through to the floating gate $7p$ to the drain region, causing the threshold voltage to shift in the positive direction so that in the read mode the cell will be 'off'. In the read mode, the control gate is held at the integrated circuit supply voltage ($V_{cc}$), which would be lower than the threshold voltage of the EEPROM cell after being erased, but higher than the threshold voltage of the EEPROM cell after being programmed.

As shown in FIG. 2, the thin tunneling oxide $11p$, generally about 10 nM, is usually isolated to a small area over the drain region, to facilitate tunnelling. The floating gate extends over part of the drain region and part of the channel, whereas the remaining part of the channel is covered by the control gate. Programming is achieved by applying a high positive voltage to the control gate and grounding the source region. Hot electrons generated in the channel are injected into the floating gate resulting in an upward shift in threshold voltage. Erasure is achieved by cold electron emission of electrons from the floating gate when the control gate was grounded and the source is held at a positive voltage.

SUMMARY OF THE INVENTION

In accordance with the present invention, an electrically erasable programmable read only memory (EEPROM) cell with a polysilicon spacer (polyspacer) floating gate formed is provided. In one embodiment, the EEPROM cell with a polyspacer floating gate also includes a source region, a drain region, a lightly doped drain (LDD) region, a gate oxide, a select gate, a control gate, a first isolation layer and a second isolation layer. The source region is formed in a semiconductor substrate, with the LDD region formed in the substrate spaced apart from the source region. The drain region is formed in said substrate adjacent to the LDD region, and the gate oxide layer is formed on the top surface of the semiconductor substrate between the source region and said LDD region. The select gate is formed atop of a portion of the gate oxide layer adjacent to the source region, and the first isolation layer is formed on the side wall of the select gate. In one embodiment, the floating gate is implemented as a spacer formed on one side of the selected gate. The floating gate is formed beside the first isolation layer and on a portion of the gate oxide. The floating gate is used to store a charge to shift the threshold voltage of the EEPROM cell. The second isolation layer is formed atop the floating gate, a portion of the select gate, and the lightly doped drain. The control gate is formed atop the second isolation layer.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1:
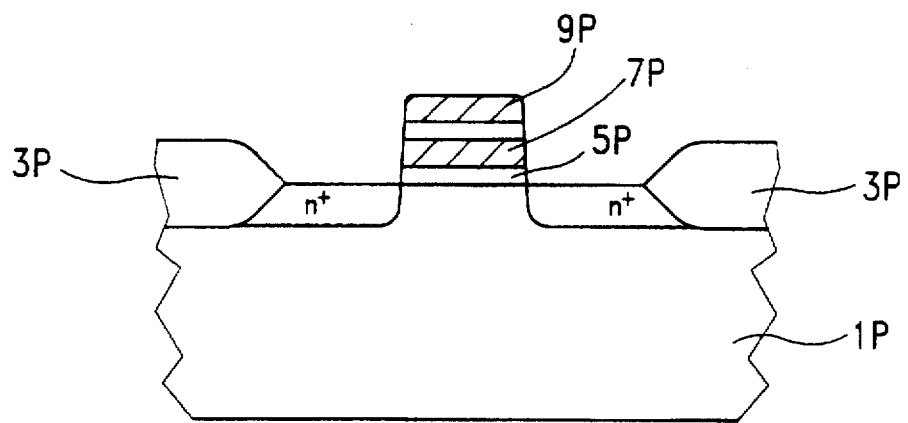
FIG. 1 is a cross section view of a semiconductor wafer illustrating the structure of a conventional EPROM.
Figure 2:
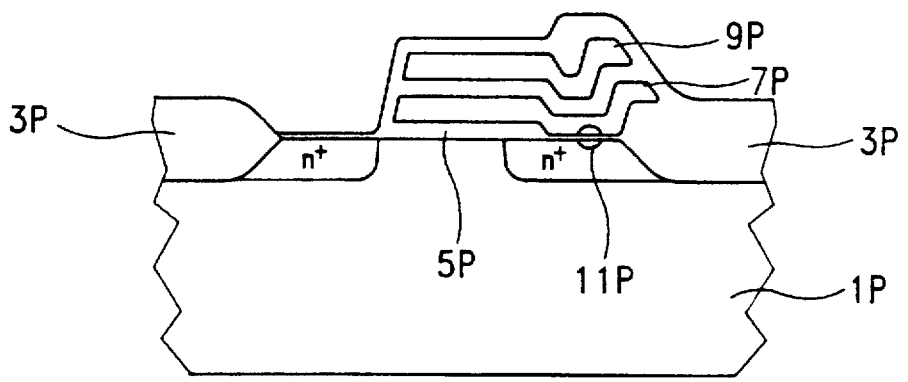
FIG. 2 is a cross section view of a semiconductor wafer illustrating the structure of a conventional EEPROM having a thin tunneling oxide that is isolated to a small area over the drain region.
Figure 3:
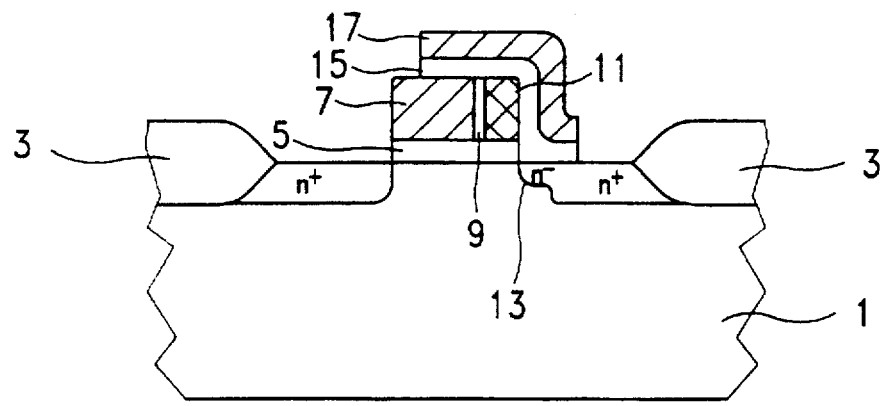
FIG. 3 is a cross section view of a semiconductor wafer illustrating the structure of an EEPROM formed in accordance with the present invention.

FIG. 3 shows a cross sectional view of one embodiment of an electrically erasable programmable read only memory (EEPROM) cell with a polyspacer floating gate, in accordance with the present invention. As shown in FIG. 3, the EEPROM device includes source and drain regions (designated as $n^+$), a lightly doped drain (LDD) region 13, a semiconductor substrate 1, field oxide 3, gate oxide 5, a polysilicon select gate 7,.

The LDD region 13 is formed adjacent to the drain region and between the drain region region and the channel for the purpose of reducing hot carriers near the drain junction. The gate oxide 5 is formed preferably from a layer of silicon dioxide. A polysilicon select gate 7 is formed on the silicon dioxide layer 5, the length of the select gate 7 being shorter than the channel length. In this embodiment, the length of the select gate 7 is about 0.2 microns. A polysilicon spacer 11 is formed adjacent to the select gate 5. The polysilicon spacer 11 is also referred to herein as the floating gate 11. Between the select gate 7 and the floating gate 11 is a silicon dioxide layer 9 for the purpose of isolating the floating gate 11 from the select gate 7. The floating gate 11 extends over a part of the channel, with the remaining part of the channel being covered by the select gate 9. In this embodiment, the length of the floating gate 11 is about 0.1 microns. An isolation layer 15 having a length of about 300 angstroms is formed on top of the select gate 7 and the floating gate 11. The isolation layer 15 can be any suitable insulating material such as, for example, silicon dioxide. A control gate 17 is formed on the isolation layer 15, and, in this embodiment, is formed of polysilicon.

The EEPROM cell depicted in FIG. 3 operates as follows. In the programming mode, the control gate 17, the select gate 7 and the drain region are coupled to a source of positive voltage, while the source region is grounded. The operation voltage is shown in TABLE 1. As a result, hot electrons are from the channel of the EEPROM cell, through the gate oxide layer 5, to the floating gate 11. Thus, after programming, negative charge is stored on the floating gate 11, which shifts the threshold voltage of the EEPROM cell higher. Accordingly, the programmed EEPROM cell is nonconductive during the read mode.

TABLE 1

|  | voltage of select gate | voltage of control gate | voltage of drain | voltage of source |
|---|---|---|---|---|
| program | 3.3 V | 10 V | 0 V | 5 V |
| erase | 0 V | −10 V | floating | 7 V |
| read | 3.3 V | 0 V | 1.2 V | 0 V |

However, in programming an EEPROM cell, the bit line providing the high positive voltage to the drain region is also electrically connected to the drain regions of other adjacent EEPROM cells in the memory array. For example, if the EEPROM cell depicted in FIG. 3 was unselected, the EEPROM cell may still have its drain region held at a high positive voltage. In this case, the drain region would be at a high positive voltage, but the control gate, the select gate would be typically be grounded. These voltage conditions can allow hot electron injection in a conventional EEPROM cell.

However, in this embodiment of the present invention, the LDD region 13 helps reduce hot electrons from being generated and swept into the channel of unselected EEPROM cells.

In the erase mode, the drain region is held at the high voltage level while the select gate 7 is coupled to a negative voltage source. Because the select gate is held at a negative voltage, the cell is turned off and no carriers can flow in the channel, thereby conserving power. More specifically, the device is erased without causing current to flow through the channel of the device, which reduces power dissipation during the erase mode. As a result, electrons tunnel from the floating gate 11 to the LDD region 13, thereby discharging the floating gate. Thus, the EEPROM cell is erased and will be conductive when the control gate 17 and select gate 7 are impressed with a logic high voltage.

In addition, the structure of an EEPROM cell according to the present invention provides a better topography than most conventional EEPROM cells because the stacked dual polysilicon gates of the conventional structure is relatively tall. As a result, the topography of many conventional EEPROM cells is very nonplanar. In contrast, the sidewall spacer floating gate structure of the present invention has, in effect, only a single gate stack, thereby resulting in a relatively planar topography. Further, this "single gate stack" structure also facilitates scaling down the device size because a more simple process is used to fabricate the EEPROM cell array.

The formation of the EEPROM cell with a polyspacer floating gate described herein includes many process steps that are well known in the art. For example, the process of photolithographic masking and etching is used extensively herein. This process consists of creating a photolithography mask containing the pattern of the component to be formed, coating the wafer with a light sensitive material known as a photoresist, exposing the photoresist coated wafer to ultraviolet light through the mask to soften or harden parts of the photoresist (depending on whether positive or negative photoresist is used), removing the softened parts of the photoresist, etching to remove the materials left unprotected by the photoresist and stripping the remaining photoresist.

This photolithographic masking and etching process is referred to as "patterning and etching."

Figure 4:
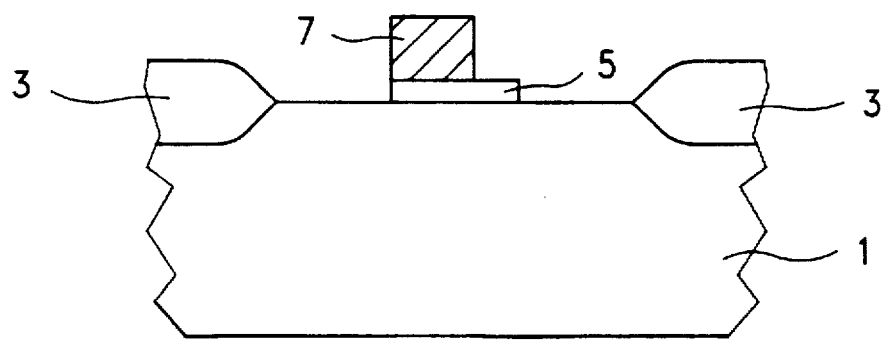
FIG. 4 is a cross section view of a semiconductor wafer illustrating the step of forming a gate oxide and a select gate according to one embodiment of the present invention.

As will be seen below, this technique can be used to form one embodiment of an EEPROM cell in accordance with the present invention. Referring to FIG. 4, a silicon wafer preferably comprising a single crystal substrate 1 is shown.

In this embodiment, the single crystal substrate 1 is P-type with a <100> crystallographic orientation. First, a thick field oxide region (FOX) 3 is formed for purposes of isolation. The FOX 3 region is created via photolithography and dry etching steps to etch a silicon nitride-silicon dioxide composite layer. After the photoresist is removed and wet cleaned, a thermal oxidation in an oxygen steam ambient is used to form the FOX 3 region, at a thickness about 4000–6000 angstroms.

Next, a first silicon dioxide layer 5 is formed on the substrate 1 to act as the gate oxide 5. The first silicon dioxide layer is formed by using an oxygen-steam ambient, at a temperature between about 850° to 1000° C., to a thickness about 140 angstroms. A first polysilicon layer 7 is then formed over the first silicon dioxide layer 5 and silicon substrate 1 and field oxide regions 3. The first polysilicon layer 7 is formed using conventional chemical vapor deposition (CVD). It can be appreciated that other methods of depositing the first polysilicon layer 7 can also be used. The thickness of the first polysilicon layer 7 is optimally 2000 angstroms. In this embodiment, the first polysilicon layer 7 is chosen from doped polysilicon or in-situ doped polysilicon. Next, a standard patterning and etching process is used to etch the first polysilicon layer 7 and silicon dioxide 5 to form a gate oxide layer with a select gate over a portion of the gate oxide, as shown in FIG. 4.

Figure 5:
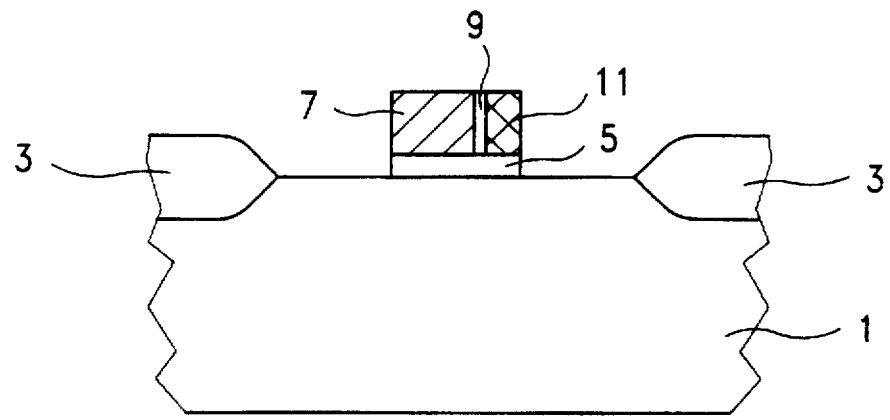
FIG. 5 is a cross section view of a semiconductor wafer illustrating the step of forming a floating gate according to one embodiment of the present invention.
Figure 6:
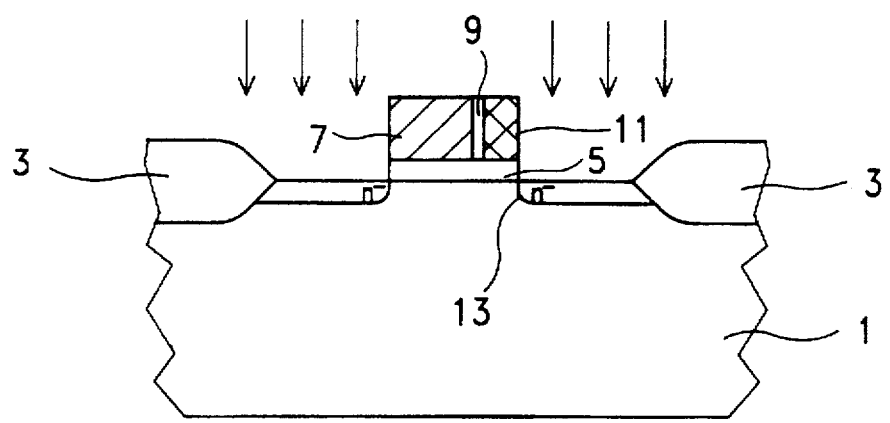
FIG. 6 is a cross section view of a semiconductor wafer illustrating the step of forming a lightly doped drain according to one embodiment of the present invention.

Referring next to FIGS. 5 and 6, a second silicon dioxide layer 9 is formed on the side wall of first polysilicon layer 7. Next, a second polysilicon spacer 11 is formed adjacent to the select gate 7. The polysilicon spacer 11 forms the floating gate 11. Then an ion implantation is performed to create the LDD region 13, the lightly doped drain region 13 is formed to be self aligned with the floating gate 11, as shown in FIG. 6. A suitable dopant such as, for example, phosphorus is implanted at a dosage of approximately 2E13.

Figure 7:
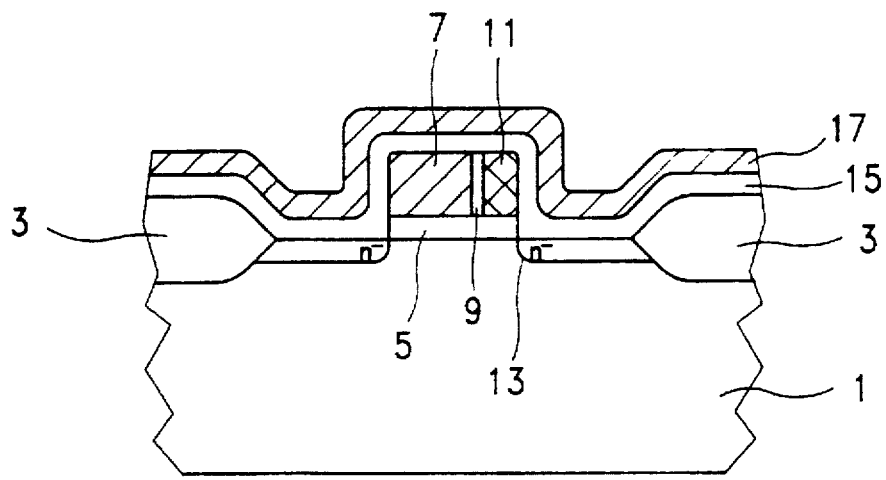
FIG. 7 is a cross section view of a semiconductor wafer illustrating the step of forming a third silicon dioxide layer and a third polysilicon layer on the floating gate and on the select gate, according to one embodiment of the present invention.

As shown in FIG. 7, a third silicon dioxide layer 15 is formed on the select gate 7, the floating gate 11, the field oxide region 3, and the substrate 1. In this embodiment, the third silicon dioxide layer is deposited using a standard CVD process to a thickness of about 200 to 300 angstroms. Then a third polysilicon layer 17 is formed on the third silicon dioxide layer 15 to a thickness of about 1500 to 2000 angstroms. The third polysilicon layer 17 is used for forming a control gate.

Figure 8:
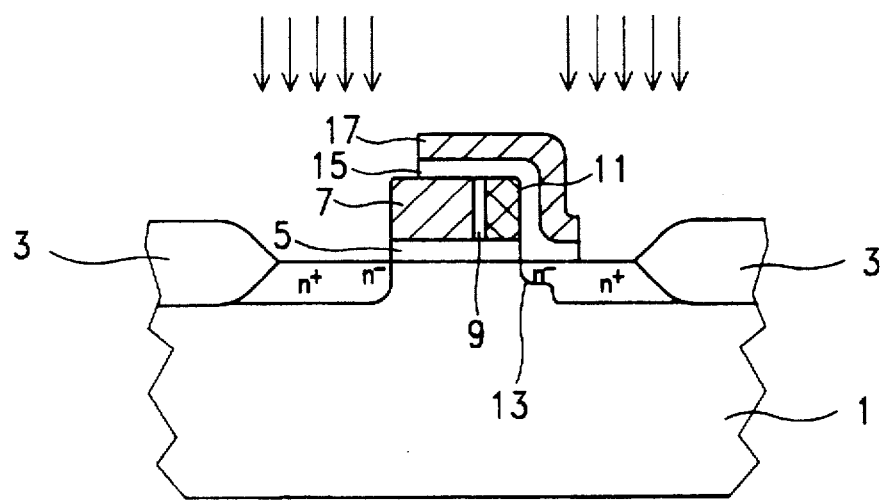
FIG. 8 is a cross section view of a semiconductor wafer illustrating the step of forming a source region and a drain region of the device, according to one embodiment of the present invention.

Next, as seen in FIG. 8, a standard patterning and etching process is used to etch the third polysilicon layer 17 and the third silicon dioxide layer 15 to form the control gate. As can be seen, the control gate 17 extends over a portion of the select gate 7, the entire floating gate 11, and a portion of the LDD region 13. Then, another ion implantation step is performed to form the heavy doped source and drain regions. The source and drain regions are formed by implanting arsenic at a dosage of about 3E15. In addition, a rapid thermal process is performed to drive the ions into the substrate 1. Thus, an EEPROM cell with polyspacer is formed as shown in FIG. 8.

As can be understood by those skilled in the art, the foregoing preferred embodiments of the present invention are illustrative of the present invention rather than limiting of the present invention. It is intended to cover various modifications and similar arrangements included within the spirit and scope of the appended claims, the scope of which should be accorded the broadest interpretation so as to encompass all such modifications and similar structure. While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method of fabricating an EEPROM cell on a semiconductor substrate, said method comprising:

forming a gate oxide on said substrate;

forming a first polysilicon layer on said gate oxide;

patterning a second photoresist on said first polysilicon layer;

etching said first polysilicon layer to form a select gate;

forming a first isolation layer on a side wall of said select gate;

forming a floating gate on said gate oxide adjacent to said first isolation layer;

forming a lightly doped drain by ion implantation;

forming a second isolation layer on a portion of said select gate, said floating gate, and a portion of said lightly doped drain;

forming a control gate on said second isolation layer; and forming a heavily doped source and drain using ion implantation.

2. The method of claim 1, wherein forming said floating gate comprises forming a polysilicon spacer adjacent to said first isolation layer.

3. The method of claim 1, wherein said lightly doped drain region is e self aligned with said floating gate.

* * * * *